United States Patent
Lee et al.

(10) Patent No.: US 8,003,546 B2
(45) Date of Patent: Aug. 23, 2011

(54) METHOD OF GROWING SILICON AND METHOD OF MANUFACTURING SOLAR CELL USING THE SAME

(75) Inventors: Jung-hyun Lee, Suwon-si (KR); Chang-soo Lee, Suwon-si (KR); Dong-joon Ma, Anyang-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/461,502

(22) Filed: Aug. 13, 2009

(65) Prior Publication Data

US 2010/0151617 A1 Jun. 17, 2010

(30) Foreign Application Priority Data

Dec. 16, 2008 (KR) ........................ 10-2008-0128184

(51) Int. Cl.
*H01L 21/31* (2006.01)
(52) U.S. Cl. . 438/758; 438/492; 438/507; 257/E21.606; 257/E21.703
(58) Field of Classification Search ................... 438/178, 438/497, 503, 764; 257/E21.069, E21.079, 257/E21.08, E21.603, E21.606, E21.607, 257/E21.698
See application file for complete search history.

(56) References Cited

U.S. PATENT DOCUMENTS

| 6,007,869 | A | 12/1999 | Schreieder et al. | |
|---|---|---|---|---|
| 6,932,954 | B2 | 8/2005 | Wakamatsu et al. | |
| 2002/0104474 | A1 | 8/2002 | Wakamatsu et al. | |
| 2003/0202792 | A1* | 10/2003 | Goshi | 396/564 |
| 2005/0181613 | A1* | 8/2005 | Xu et al. | 438/689 |
| 2005/0181633 | A1* | 8/2005 | Hochberg et al. | 438/787 |
| 2006/0174935 | A1* | 8/2006 | Sawada et al. | 136/261 |
| 2010/0055007 | A1* | 3/2010 | Ishii | 422/199 |

FOREIGN PATENT DOCUMENTS

| JP | 60-077117 | 5/1985 |
|---|---|---|
| JP | 61-247614 | 11/1986 |
| JP | 04-193706 | 7/1992 |
| JP | 2006-321675 | 11/2006 |
| KR | 10-2003-0038670 | 5/2003 |
| KR | 10-2007-0084435 | 8/2007 |

* cited by examiner

*Primary Examiner* — Cheung Lee
(74) *Attorney, Agent, or Firm* — Harness, Dickey & Pierce, P.L.C.

(57) ABSTRACT

In a method of growing silicon (Si) using a reactor, a supercritical fluid including a silicon Si source and hydrogen flows in the reactor, and the Si source reacts with hydrogen. A base substrate of a solar cell may be formed with Si made using the method of growing silicon (Si). The supercritical fluid may be a fluid in which Si is not oxidized and may be, for example, a $CO_2$ supercritical fluid with a pressure of about 60 to about 200 atm. The Si source may be TriChloroSilane (TCS) ($SiCl_3H$) or $SiH_4$.

16 Claims, 2 Drawing Sheets

US 8,003,546 B2

METHOD OF GROWING SILICON AND METHOD OF MANUFACTURING SOLAR CELL USING THE SAME

CROSS-REFERENCE TO RELATED APPLICATIONS

This application claims priority under 35 USC §119 to Korean Patent Application No. 10-2008-0128184, filed on Dec. 16, 2008, in the Korean Intellectual Property Office, the entire contents of which are incorporated herein by reference.

BACKGROUND

1. Field

Example embodiments relate to a method of growing silicon (Si) and a method of manufacturing a solar cell using the method of growing Si.

2. Description of the Related Art

Silicon (Si), copper indium gallium (di) selenide (CIGS), and cadmium Tellurium (CdTe) are being developed as materials of a substrate used in solar cells. In consideration of high photoelectrical conversion efficiency and processibility relating to use of general semiconductor/display processes, solar cells using a Si substrate will be mainly used in the future.

The Si substrate for solar cells may be formed using a method (hereinafter, referred to as a first method) of growing Si on a Si rod by reacting TriChloroSilane (TCS) ($SiCl_3H$) with hydrogen, or a method (hereinafter, referred to as a second method) of growing Si on a Si seed by reacting silane ($SiH_4$) gas with hydrogen using flow gas.

In the first method, power is applied to a Si core rod included in a reactor, and thus, heat is generated in the Si rod surrounding the Si core rod so that the Si rod maintains a high temperature. $SiCl_3H$ and $H_2$ injected into the reactor react, thereby generating Si that attaches to the Si rod. As a result, Si is grown on the Si rod.

In the second method, the temperature of a reaction tube in a reactor increases, and then, reaction gas and Si powder are inserted into the reaction tube. Si is generated due to the reaction result of the reaction gas and a Si source gas supplied to the reaction tube. The generated Si is attached to a Si particle in the Si powder. As a result, Si is grown on Si particles in the Si powder. According to the second method, Si powder may be formed by a rapid reaction and according to the first method, extraction rate of Si from TCS is low.

SUMMARY

Example embodiments include a method of growing silicon (Si) for increasing extraction rate of Si from TriChloroSilane (TCS). Example embodiments include a method of manufacturing a solar cell using the method of growing Si. Additional aspects will be set forth in part in the description which follows and, in part, will be apparent from the description, or may be learned by practice of example embodiments.

According to example embodiments, a method of growing silicon (Si) using a reactor may include flowing a supercritical fluid including a Si source and hydrogen in the reactor, and reacting the Si source with hydrogen.

The supercritical fluid may flow using an impeller. The reactor may include a Si rod configured to attach Si generated due to the reaction of the Si source and hydrogen. The supercritical fluid may be heated by supplying power to the Si rod for reacting the Si source with hydrogen.

The supercritical fluid may include Si powder configured to attach Si generated due to the reaction of the Si source and hydrogen. The supercritical fluid may be heated by using a separate heater included in the reactor for reacting the Si source with hydrogen.

The supercritical fluid is a fluid in which Si is not oxidized and may be, for example, a $CO_2$ supercritical fluid with a pressure of about 60 to about 200 atm. The supercritical fluid and hydrogen may be supplied to the reactor and then the Si source may be supplied to the reactor.

The supercritical fluid may be heated until the temperature thereof reaches from about 550° C. to about 800° C. The supercritical fluid, hydrogen, and the Si source may be supplied through the same supply pipe. The supercritical fluid and hydrogen may be supplied through a different supply pipe from that of the Si source.

The reactor may be heated to a temperature at which the Si source reacts with hydrogen before supplying the supercritical fluid and hydrogen to the reactor. The supercritical fluid, hydrogen, and the Si source may be simultaneously supplied to the reactor but the supercritical fluid and hydrogen may be supplied through a different supply pipe from that of the Si source.

According to example embodiments, a method of manufacturing a solar cell using a silicon (Si) substrate as a base substrate, wherein the Si substrate is made of Si formed using the method of growing Si of example embodiments.

The method may further include preparing the Si substrate, and sequentially forming elements of the solar cell on the Si substrate. All of the elements or a portion of the elements of the solar cell may be formed on the Si substrate.

The supercritical fluid is used as the transport medium of the Si source, hydrogen, and Si powder so as to increase the Si extraction rate from the Si source. Accordingly, a manufacturing cost of the Si substrate may be reduced, and a manufacturing cost of a solar cell using the Si substrate as a base substrate may also be reduced.

BRIEF DESCRIPTION OF THE DRAWINGS

These and/or other aspects will become apparent and more readily appreciated from the following description of example embodiments, taken in conjunction with the accompanying drawings of which.

DETAILED DESCRIPTION

Figure 1:
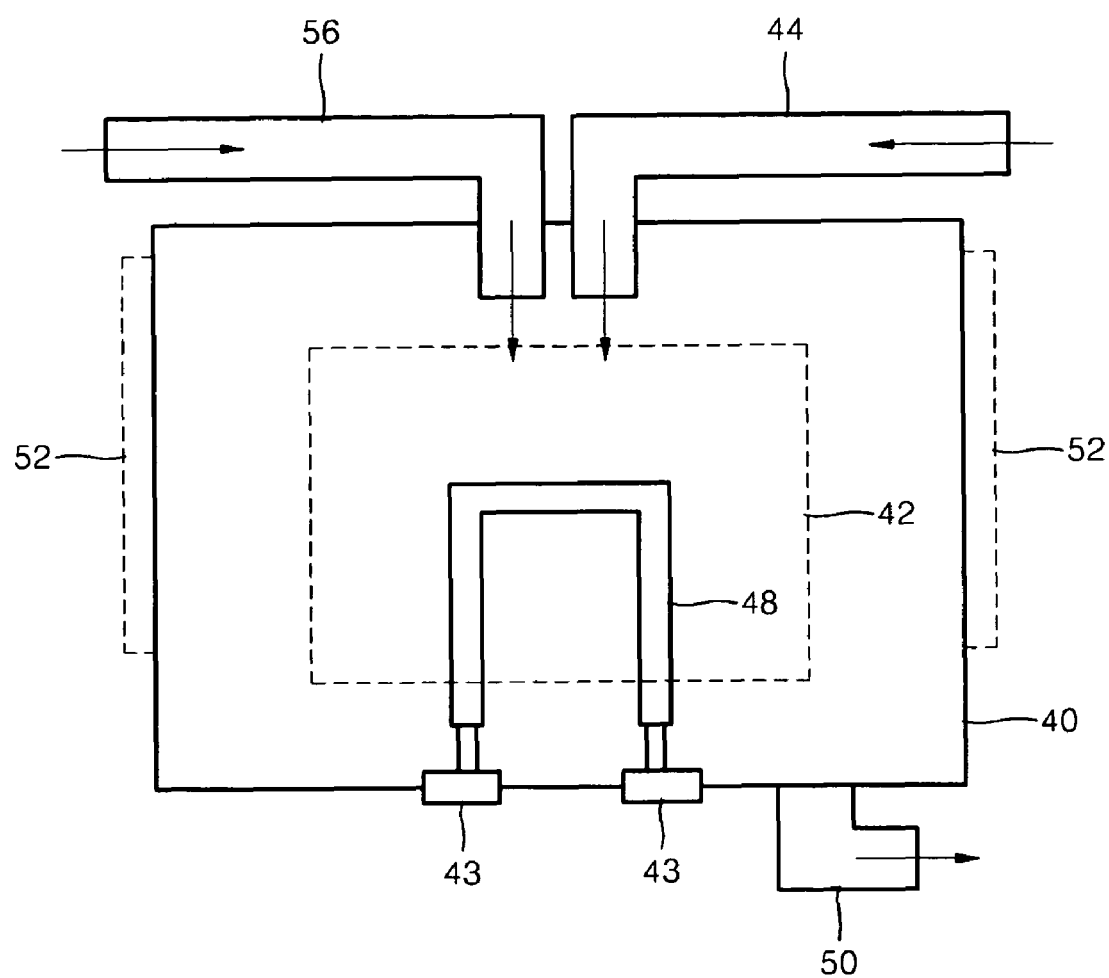
FIG. 1 is a diagram schematically illustrating a reactor used in a method of growing silicon (Si) according to example embodiments.

Hereinafter, a method of growing silicon (Si) and a method of manufacturing a solar cell using the method of growing Si will be described more fully with reference to the accompanying drawings. Example embodiments may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The method of growing Si will be described. FIG. 1 is a diagram schematically illustrating a reactor 40 used in a method of growing Si according to example embodiments, and FIG. 2 is a flowchart illustrating the method of growing Si as performed by the reactor 40 of FIG. 1.

Figure 2:
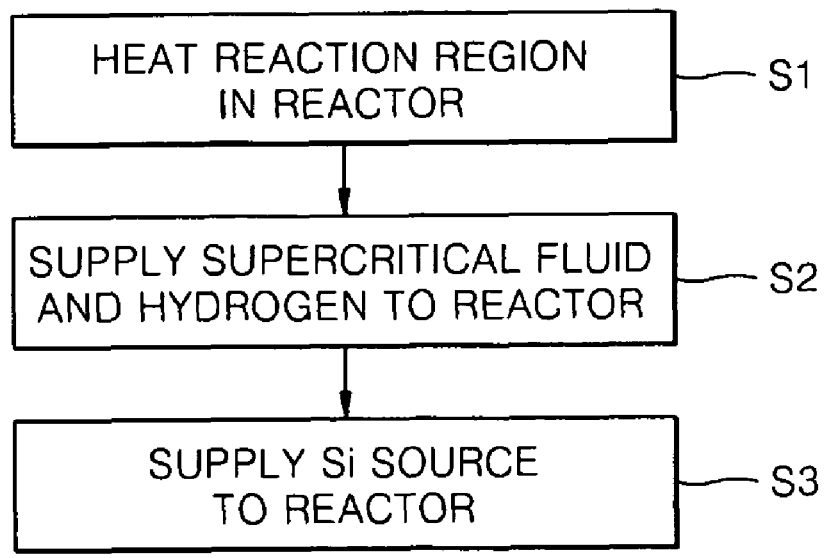
FIG. 2 is a flowchart illustrating a method of growing Si according to example embodiments.

Referring to FIGS. 1 and 2, in the method of growing Si according to example embodiments, a reaction region 42 in the reactor 40 may be heated to a proper temperature so as to react a Si source with hydrogen, in S1. The reaction region 42 may be heated using a Si rod 48 included therein. That is, the reaction region 42 may be heated by applying power to the Si rod 48 through electrodes 43, and thereby, heating the Si rod 48. Accordingly, the reaction region 42 may be maintained from about 550° C. to about 800° C. around the Si rod 48. The Si rod 48 may be used as a base to which Si to be generated by the reaction of the Si source with hydrogen is attached and grown.

In S2, a $CO_2$ supercritical fluid and hydrogen may be supplied to the reactor 40 through a first supply pipe 44. The $CO_2$ supercritical fluid may be used as a transport medium of the Si source and hydrogen. When Si powder is supplied to the reactor 40 as a base material for attaching Si to be generated in the reactor 40, the $CO_2$ supercritical fluid may also be a transport medium of the Si powder.

Hydrogen and $CO_2$ may be injected into the reactor 40 with a pressure above 60 atm and below 100 atm. An impeller (not shown) may be included in the reactor 40 for flowing the $CO_2$ supercritical fluid. The $CO_2$ supercritical fluid may flow in the reaction region 42 due to the impeller and thereby a change of reacting hydrogen with the Si source increases in the reaction region 42. As a result, the extraction rate of Si from the Si source may increase. In S3, the Si source may be supplied to the reactor 40 through the first supply pipe 44.

The Si source may be supplied to the reaction region 42 at a high pressure. The supplied pressure of the Si source may be the same as that of $CO_2$. The Si source may be TriChloroSilane (TCS) or $SiH_4$. Due to the flowing of the $CO_2$ supercritical fluid, which is $CO_2$, the Si source may react with hydrogen in the reaction region 42, and thus, Si may be generated. The generated Si may be attached to the Si rod 48 and is grown on the Si rod 48.

When the Si source sufficiently reacts with hydrogen, hydrogen, the $CO_2$ supercritical fluid, the non-reacted Si source, and by-products, for example, $SiCl_x$ and HCl, may be discharged through a discharge pipe 50. Moreover, when Si is not oxidized, a supercritical fluid that uses another gas may be used instead of the $CO_2$ supercritical fluid. For example, $NH_3$ or hydrocarbon supercritical fluid may be used instead of the $CO_2$ supercritical fluid.

Table 1 below shows Si extraction rate in the method according to example embodiments and a general method. In the general method, a reactor including a Si rod is used or a reactor that uses a flow gas is used.

TABLE 1

| | Si extraction rate (%) | |
| --- | --- | --- |
| Temperature (° C.) | Method according to example embodiments | General method |
| 550 | 13% | No extraction |
| 650 | 21% | No extraction |
| 750 | 40% | No extraction |
| 850 | No extraction | 11% |

In order to obtain the results shown in Table 1, Si is grown at 550° C., 650° C., 750° C., and 850° C. according to the method of example embodiments and the general method. The pressure of the $CO_2$ supercritical fluid may be about 100 atm. Also, the reactor including the Si rod may be used.

Referring to Table 1, in the method of example embodiments, Si is extracted at about 550° C., 650° C., and 750° C. and the Si extraction rates are all above about 11%; whereas Si is not extracted in the general method. In the general method, Si is extracted at about 850° C. and the Si extraction rate is about 11%.

According to the results shown in Table 1, the Si extraction rate is greater in the method of example embodiments than that of the general method. Also, the temperature needed for Si extraction is lower in the method of example embodiments than that of the general method. Thus, the method of example embodiments may be used to obtain a Si substrate at a lower price than that of the general method.

Moreover, Si powder may be supplied to the reaction region 42 in the reactor 40 instead of the Si rod 48. The Si powder may be supplied with a pressure that is the same as that of when $CO_2$ is supplied. When the reaction region 42 is heated, the Si powder may be supplied through the first supply pipe 44 before hydrogen and $CO_2$. In addition, the Si powder may be supplied to the reactor 40 before the reaction region 42 is heated. The Si powder may be supplied through a separate supply pipe. When the Si powder is used, the reaction region 42 may be heated using a heater 52 disposed on the outer wall of the reactor 40. When a separate reaction tube is included in the reactor 40, the heater 52 may be disposed on the outer wall of the reaction tube. The Si powder may be mixed with the Si source and hydrogen in the reaction region 42 according to the flow of the $CO_2$ supercritical fluid. Accordingly, the probability that the Si source reacts with hydrogen increases and thereby the probability of extracting Si from the Si source also increases. Si generated as a result of the reaction of the Si source and hydrogen may be attached to Si of the Si powder and is grown, thereby forming Si granules.

In addition, hydrogen, the $CO_2$ supercritical fluid, and the Si source may be simultaneously supplied to the reactor 40. Hydrogen and the $CO_2$ supercritical fluid may be applied to the reactor 40 through the first supply pipe 44 and the Si source may be supplied to the reactor 40 through a second supply pipe 56. In example embodiments, the Si powder may be used as a base for growing Si instead of the Si rod 48, and the Si powder may be supplied through the first supply pipe 44 or the second supply pipe 56. When the first supply pipe 44 or the second supply pipe 56 is used, hydrogen, the $CO_2$ supercritical fluid, and the Si source may not be simultaneously supplied to the reactor 40. For example, hydrogen and the $CO_2$ supercritical fluid may be supplied to the reactor 40 through the first supply pipe 44 and the Si source may be supplied to the reactor 40 through the second supply pipe 56.

When the Si powder is used as a Si growing base, the $CO_2$ supercritical fluid decompresses during the discharging of the $CO_2$ supercritical fluid including Si granules after the growing of Si is completed. Thus, the Si granules included in the $CO_2$ supercritical fluid may be separated from the $CO_2$ supercritical fluid.

When the base for growing Si is the Si powder, the Si powder may be supplied to the reaction tube including the heater. The Si source and hydrogen may also be supplied through the reaction tube. The reaction tube is disposed in the reactor 40 and the heater 52 may surround the reaction tube.

Figure 3:
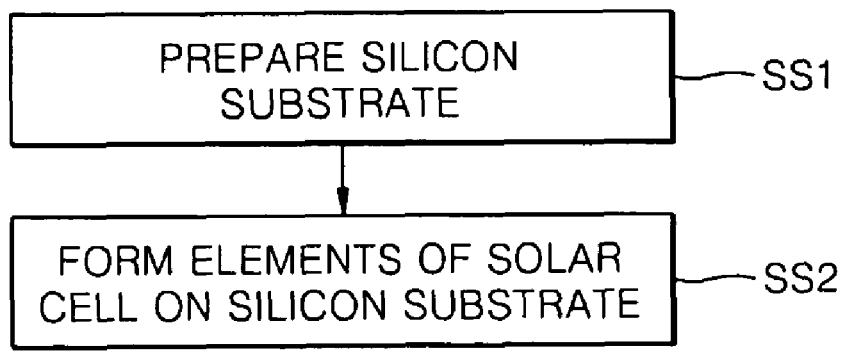
FIG. 3 is a flowchart illustrating a method of manufacturing a solar cell according to example embodiments.

The method of manufacturing the solar cell according to example embodiments will be described with reference to FIG. 3. Referring to FIG. 3, a Si substrate may be prepared in SS1. Elements of the solar cell may be sequentially formed on the prepared Si substrate in SS2. During preparation of the Si substrate in SS1, the Si substrate may be formed using the method described above. The elements formed on the Si substrate may be the same as general elements of a solar cell. All or part of the elements of the solar cell may be formed on the Si substrate.

The elements described above are for illustrative purposes and are not intended to limit the scope of a method of growing Si and a method of manufacturing a solar cell. For example, other materials may be used as the Si source material, instead of TSC ($SiCl_3H$) and $SiH_4$. Also, the method of growing Si using the $CO_2$ supercritical fluid may be performed using a reactor having another structure.

It should be understood that example embodiments described therein should be considered in a descriptive sense only and not for purposes of limitation. Descriptions of features or aspects within each example embodiment should typically be considered as available for other similar features or aspects in other example embodiments.

What is claimed is:

1. A method of growing silicon (Si) using a reactor, the method comprising:
   flowing a supercritical fluid including a silicon (Si) source and hydrogen in the reactor; and
   reacting the Si source with the hydrogen,
   wherein the supercritical fluid includes Si powder configured to attach Si generated due to the reaction of the Si source and hydrogen.

2. The method of claim 1, wherein the supercritical fluid flows using an impeller.

3. The method of claim 1, wherein the Si source is TriChloroSilane (TCS) or $SiH_4$.

4. The method of claim 1, wherein the supercritical fluid is $CO_2$ with a pressure of about 60 to about 200 atm.

5. The method of claim 1, wherein the supercritical fluid and hydrogen are supplied to the reactor and then the Si source is supplied to the reactor.

6. The method of claim 5, wherein the supercritical fluid, hydrogen, and the Si source are supplied through the same supply pipe.

7. The method of claim 5, wherein the supercritical fluid and hydrogen are supplied through a different supply pipe from that of the Si source.

8. The method of claim 5, wherein the reactor is heated to a temperature at which the Si source reacts with hydrogen before supplying the supercritical fluid and hydrogen to the reactor.

9. The method of claim 1, wherein the supercritical fluid is heated by using a separate heater included in the reactor for reacting the Si source with hydrogen.

10. The method of claim 9, wherein the supercritical fluid is heated until the temperature reaches about 550° C. to about 800° C.

11. The method of claim 1, wherein the supercritical fluid, hydrogen, and the Si source are simultaneously supplied to the reactor but the supercritical fluid and hydrogen are supplied through a different supply pipe from that of the Si source.

12. The method of claim 1, wherein the supercritical fluid is a $NH_3$ supercritical fluid or a hydrocarbon supercritical fluid.

13. A method of manufacturing a solar cell using a silicon (Si) substrate as a base substrate, wherein the Si substrate is made of Si formed using the method of claim 1.

14. The method of claim 13, wherein the method further includes preparing the Si substrate, and sequentially forming elements of the solar cell on the Si substrate.

15. The method of claim 14, wherein all of the elements of the solar cell are formed on the Si substrate.

16. The method of claim 14, wherein a portion of the elements of the solar cell are formed on the Si substrate.

* * * * *